(12) United States Patent
Ibrahim et al.

(10) Patent No.: US 11,111,020 B2
(45) Date of Patent: *Sep. 7, 2021

(54) SYSTEMS AND METHODS FOR PROVIDING ELECTRICAL SIGNALS TO ELECTRICAL DEVICES WITHIN AN INTERIOR CABIN OF A VEHICLE

(71) Applicant: THE BOEING COMPANY, Chicago, IL (US)

(72) Inventors: Yakentim Ibrahim, Brier, WA (US); Robert Thomas Johnson, Everett, WA (US); Mark Gus Mehlhaff, Seattle, WA (US); Daniel Keith Bittner, Everett, WA (US)

(73) Assignee: THE BOEING COMPANY, Chicago, IL (US)

( * ) Notice: Subject to any disclaimer, the term of this patent is extended or adjusted under 35 U.S.C. 154(b) by 52 days.

This patent is subject to a terminal disclaimer.

(21) Appl. No.: 16/680,540

(22) Filed: Nov. 12, 2019

(65) Prior Publication Data
US 2020/0079509 A1   Mar. 12, 2020

Related U.S. Application Data

(63) Continuation of application No. 15/287,949, filed on Oct. 7, 2016, now Pat. No. 10,513,335.

(51) Int. Cl.
*B64D 11/00* (2006.01)
*B64D 11/06* (2006.01)
(Continued)

(52) U.S. Cl.
CPC .......... *B64D 11/0015* (2013.01); *B64D 11/00* (2013.01); *B64D 11/0624* (2014.12);
(Continued)

(58) Field of Classification Search
CPC ................... B64D 2221/00; H02J 2310/40–48
See application file for complete search history.

(56) References Cited

U.S. PATENT DOCUMENTS 4,853,555 A * 8/1989 Wheat ...................... B64C 1/20
307/9.1
5,705,860 A    1/1998 Ninh
(Continued)

FOREIGN PATENT DOCUMENTS

JP    H10-071997    3/1998
JP    00/42686      7/2000
(Continued)

OTHER PUBLICATIONS

Machine translation for JP 00/42686.
Machine translation for JP 2013-049399.

*Primary Examiner* — Hal Kaplan
*Assistant Examiner* — David A Shiao
(74) *Attorney, Agent, or Firm* — The Small Patent Law Group LLC; Joseph M. Butscher

(57) ABSTRACT

A vehicle include an interior cabin including a plurality of structural components, a plurality of electrical devices within the interior cabin, a power supply, and an electrical signal distribution system mounted to at least one of the plurality of structural components and electrically coupled to the power supply and the plurality of electrical devices. The electrical signal distribution system includes a printed circuit board (PCB), and a plurality of outlets coupled to the PCB. The plurality of outlets electrically couple to the plurality of electrical devices. The electrical signal distribution system provides electrical signals to the plurality of electrical devices.

19 Claims, 8 Drawing Sheets

(51) Int. Cl.
 *B64C 1/06* (2006.01)
 *B64C 1/18* (2006.01)
 *H05K 1/02* (2006.01)

(52) U.S. Cl.
 CPC ............... *B64C 1/066* (2013.01); *B64C 1/18* (2013.01); *B64D 11/003* (2013.01); *B64D 2011/0038* (2013.01); *B64D 2221/00* (2013.01); *H05K 1/0218* (2013.01); *Y02T 50/40* (2013.01)

(56) References Cited

U.S. PATENT DOCUMENTS

| | | | | |
|---|---|---|---|---|
| 2005/0225955 | A1* | 10/2005 | Grebenkemper | H05K 1/0218 361/780 |
| 2006/0032979 | A1* | 2/2006 | Mitchell | B64D 11/00155 244/118.6 |
| 2010/0127123 | A1* | 5/2010 | Hoffjann | B64D 11/02 244/118.1 |
| 2012/0250879 | A1* | 10/2012 | Moody | H04N 7/18 381/86 |
| 2015/0355988 | A1 | 12/2015 | Lee | |
| 2016/0193484 | A1* | 7/2016 | Riedel | A62B 7/14 128/202.13 |
| 2017/0028947 | A1* | 2/2017 | Blanchard | B64C 3/00 |
| 2017/0254065 | A1* | 9/2017 | Hegenbart | E04B 1/343 |

FOREIGN PATENT DOCUMENTS

| | | |
|---|---|---|
| JP | 2013-049399 | 3/2013 |
| JP | 2015-229491 | 4/2018 |

\* cited by examiner

SYSTEMS AND METHODS FOR PROVIDING ELECTRICAL SIGNALS TO ELECTRICAL DEVICES WITHIN AN INTERIOR CABIN OF A VEHICLE

RELATED APPLICATIONS

This application is a continuation of U.S. patent application Ser. No. 15/287,949, entitled "Systems and Methods for Providing Electrical Signals to Electrical Devices Within an Interior Cabin of a Vehicle," filed Oct. 7, 2016, now U.S. Pat. No. 10,513,335, which is hereby incorporated by reference in its entirety.

FIELD OF EMBODIMENTS OF THE DISCLOSURE

Embodiments of the present disclosure generally relate to interior cabins within vehicles, such as commercial aircraft, and, more particularly, to systems and methods for providing electrical signals (such as power signals and data signals) to electrical devices within an interior cabin of a vehicle.

BACKGROUND OF THE DISCLOSURE

Commercial aircraft typically include an interior cabin that may be divided into numerous sections. A cockpit is generally separated from a passenger cabin, which may include a first class section, a business class section, and a coach section. The passenger cabin may also include one or more work areas for flight personnel, such as galleys, which may include food and beverage storage structures. One or more aisles pass through the passenger cabin and connect each of the passenger sections to one or more paths to one or more doors of the aircraft.

Overhead stowage bins are typically positioned above rows of seats within a commercial aircraft. Each overhead stowage bin is configured to be moved between an open position and a closed position. In the open position, passengers may place carry-on luggage within a moveable bin or bucket. Before the aircraft leaves a terminal, flight attendants ensure that each stowage bin is securely closed.

A typical commercial aircraft includes numerous electrical components within an interior cabin. For example, a passenger service unit (PSU) is associated with each seat, row of seats, or set of seats within an interior cabin of a commercial aircraft. The PSU typically includes a reading light and an oxygen supply, for example.

A PSU trough or channel extends over a length of an interior cabin of an aircraft underneath the stowbins. In order to supply power to the PSUs, numerous controllers are provided within the PSU trough. A power supply couples to each controller through a wire bundle. In order to provide power and control signals to each of the PSUs, separate and distinct wire bundles connect each controller to an associated PSU. Typically, the PSU trough is occupied by numerous wire bundles.

During a manufacturing process of an aircraft, designers specify particular controller locations in a drawing, for example, and installers interpret the drawing in order to find the separate and distinct controllers, and individually connect the controllers to the power supplies through the wired bundles. Further, the installers also connect the individual PSUs to the controllers through the separate and distinct wire bundles.

Moreover, wire bundles that are not in use are typically coiled and secured within the PSU trough, thereby occupying space therein. Further, the unused wire bundles are reviewed and distinguished by the installers to ensure whether each is in use or not.

Additionally, depending on a desired number of PSUs and/or other electrical components within an interior cabin, the various electrical components are first mapped. That is, installers determine the locations of power supplies, the locations of wire bundles, the locations of particular electrical components to connect to wire bundles, and the like. Also, in many instances, an installer may need to splice a wire bundle and connect it a particular electrical component, such as a light of a PSU. Overall, the process of connecting PSUs to controllers and power is highly variable, long, cumbersome, labor intensive, expensive, and not easily reconfigurable.

SUMMARY OF THE DISCLOSURE

A need exists for an efficient and simpler system and method of electrically coupling electrical devices onboard a vehicle to a power source and/or a data source. A need exists for a system and method of reducing wiring (and therefore weight and cost) onboard a vehicle.

With those needs in mind, certain embodiments of the present disclosure provide a vehicle that includes an interior cabin including a plurality of structural components, a plurality of electrical devices within the interior cabin, a power supply, and an electrical signal distribution system mounted to at least one of the plurality of structural components and electrically coupled to the power supply and the plurality of electrical devices. The electrical signal distribution system includes a printed circuit board (PCB), and a plurality of outlets coupled to the PCB. The plurality of outlets electrically couple to the plurality of electrical devices. The electrical signal distribution system provides electrical signals to the plurality of electrical devices.

In at least one embodiment, the PCB is a multi-layer PCB including a power layer coupled to at least one data layer. The PCB may also include first and second ground layers. The power layer and the data layer(s) may be sandwiched between the first and second ground layers. At least one of the plurality of outlets may include an electrical connector mounted on the PCB.

The plurality of structural components may include a portion of any of a stowage bin assembly (including a bin strongback), a rail of a passenger service unit (PSU), a PSU trough, a floor member of the interior cabin, a ceiling of the interior cabin, and/or a wall member of the interior cabin. In at least one embodiment, the electrical signal distribution system extends along at least a portion of a length of the interior cabin. The PCB may be parallel with a central longitudinal axis of the interior cabin.

The outlets may be regularly spaced over a length of the PCB. The electrical signals may be power signals and/or data signals, whether digital or analog.

In at least one embodiment, the vehicle includes a master control unit in communication with the plurality of electrical devices. Each of the plurality of electrical devices may include a control unit. The master control unit is in communication with the control unit of each of the plurality of electrical devices. The master control unit automatically determines a location of each of the plurality of electrical devices in response to each of the plurality of electrical devices electrically coupling to the electrical signal distribution system.

At least two of the plurality of outlets may include different keys (for example, structural features that permit mating with a certain type of reciprocal feature) or coding (for example, color coding, alphanumeric coding, and/or the like) that are associated with different types of electrical devices.

The plurality of electrical devices may include a passenger service unit including an overhead light and an oxygen supply system, a lighting assembly, a speaker, a microphone, a display, one or more sensors, an electronic latch of a stowage bin assembly, and/or various other types of electrical devices onboard a vehicle.

Certain embodiments of the present disclosure provide a method of providing electrical signals to a plurality of electrical devices within an interior cabin of a vehicle. The method includes providing a printed circuit board (PCB) of an electrical signal distribution system, coupling a plurality of outlets to the PCB, mounting the electrical signal distribution system to at least one of a plurality of structural components within the interior cabin of the vehicle, electrically coupling the electrical signal distribution system to a power supply within the interior cabin of the vehicle, electrically coupling the plurality of outlets to the plurality of electrical devices, and providing the electrical signals to the plurality of electrical devices by way of the electrical signal distribution system.

Certain embodiments of the present disclosure provide a method of manufacturing an interior cabin of a vehicle. The method includes providing a printed circuit board (PCB) of an electrical signal distribution system, coupling a plurality of outlets to the PCB, mounting the electrical signal distribution system to at least one of a plurality of structural components within the interior cabin of the vehicle, electrically coupling the electrical signal distribution system to a power supply within the interior cabin of the vehicle, electrically coupling the plurality of outlets to the plurality of electrical devices, electrically uncoupling at least a portion of the plurality of electrical devices from the plurality of outlets, reconfiguring the portion of the plurality of electrical devices within the interior cabin, and electrically coupling the at least a portion of the electrical devices to different ones of the plurality of outlets within the interior cabin.

DETAILED DESCRIPTION OF THE DISCLOSURE

Figure 1:
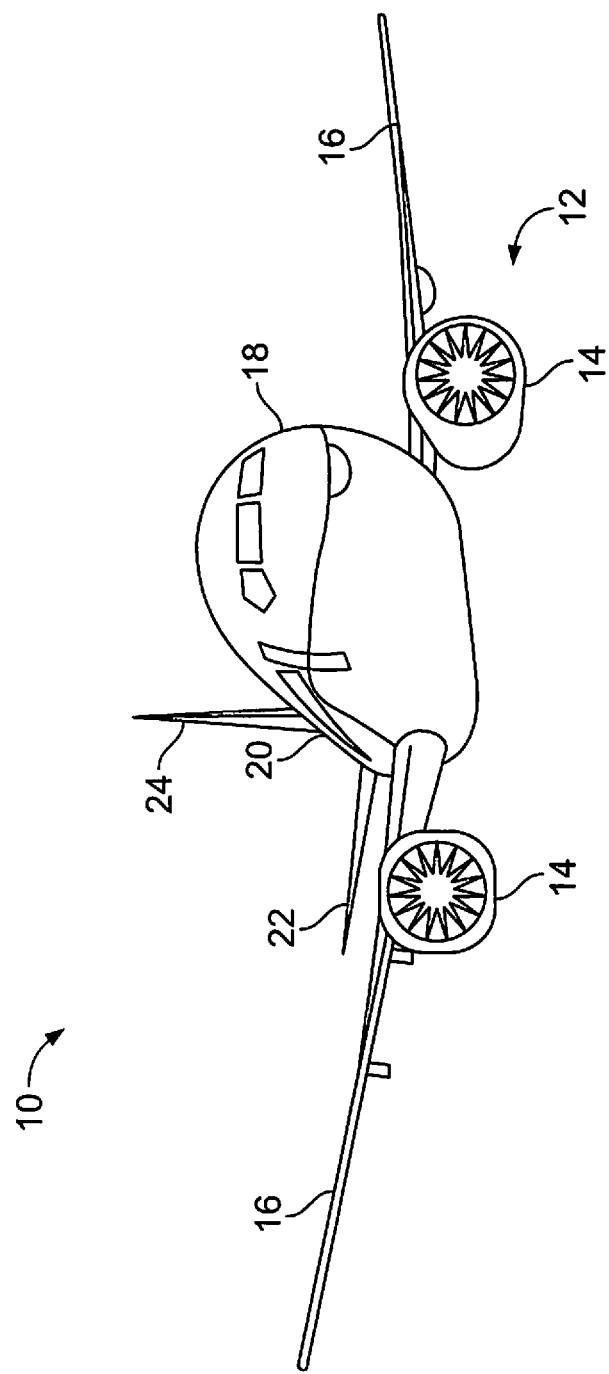
FIG. 1 illustrates a front perspective view of an aircraft, according to an embodiment of the present disclosure.

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Certain embodiments of the present disclosure provide an electrical signal distribution system that is configured to provide electrical signal communication with various electrical devices onboard a vehicle. The system is configured to communicate electrical signals, such as power signals and data signals, with respect to the various electrical devices.

The electrical signal distribution system includes a multi-layered printed circuit board (PCB) that is configured to deliver electrical signals (such as power signals and data signals) to a plurality of electrical devices having a plurality of outlets (such as ports, connectors, and/or the like), instead of through point-to-point wiring with splices (as in prior known systems). In at least one embodiment, the PCB includes multiple layers. Top and bottom layers may be ground layers that shield any noise that may be generated from signals within the inner layers of the PCB. Power, data, and discrete signals are run on the inner layers of the multi-layer PCB. Data signals may be broken at each outlet and re-connected either by an externally connected continuity connector that caps unused outlets, or by electronic devices connected to data outlets. By integrating the PCB power and data delivery system with commodities before they are brought onto a vehicle, embodiments of the present disclosure reduce factory installation time by eliminating or otherwise reducing the need to custom design and/or install wire bundles at a late stage in manufacturing of an airplane.

Embodiments of the present disclosure eliminate, minimize, or otherwise reduce a need for custom wire bundles or standard bundles that require unique drawings for coiling and stowing excess wire. Further, embodiments of the present disclosure eliminate, minimize, or otherwise reduce a need for splices and associated hardware.

Embodiments of the present disclosure provide an electrical distribution system that includes a PCB that is configured to deliver electrical signals (such as, power signals and/or data signals) to a plurality of electrical devices onboard a vehicle. The PCB eliminates wire splices by making connections directly on the PCB, such as through outlets coupled thereto. The PCB provides a powered strip that includes outlets (such as ports, connectors, and/or the like) at intervals (for example, every 6 inches) to service a configuration density of electrical devices. The PCB includes power, and data signal layers on the inside of board, with ground layers on the top and bottom layers to provide shielding for noise. The PCB may include data lines broken at each outlet. Data outlets may be pinned out so that a continuity connector or data device is used to complete a data circuit external to the PCB. The electrical distribution system may be pre-installed on components (for example, strongbacks, PSU troughs, stow bins, underneath a floor member, on or within a ceiling structure, or the like).

In at least one embodiment, the electrical signal distribution system extends over a length of an interior cabin of a vehicle. The electrical signal distribution system may run parallel to a longitudinal axis of a vehicle. The PCB of the electrical distribution system is coupled to a structure within the aircraft, such as to a stowbin, a strongback, a PSU trough, a PSU rail, underneath a floor member, within or otherwise coupled to a ceiling, and/or the like.

Embodiments of the present disclosure reduce the labor time, effort, and complexity of wiring a vehicle, such as a commercial aircraft. Further, as compared to large wire bundles, the electrical signal distribution system is substantially lighter, and allows various electrical devices to be reconfigured onboard an interior cabin. Further, the electrical signal distribution allows for various electrical devices to be quickly and easily set up and maintained within an interior cabin.

Certain embodiments of the present disclosure provide an electrical signal distribution system that includes a longitudinal PCB that provides an electrical signal strip having a plurality of outlets. The PCB is substantially aligned with a structural component within an interior cabin of a vehicle. The structural component may be one or more stowage bin assemblies, floor member structure (such as coupled to and/or between seat tracks), a ceiling, wall members, and/or the like.

Certain embodiments of the present disclosure provide a method of configuring an aircraft with a plurality of features. The method includes building a longitudinal array of a plurality electrical signal outlets, and coupling the longitudinal array to a longitudinal structure within an interior cabin of the aircraft.

Certain embodiments of the present disclosure provide an aircraft cabin recording device (for example, a flight deck handset or a cabin attendant handset) that includes one or more microphones that plug in to an array of outlets. The microphone(s) are controllable by a control unit onboard the aircraft.

FIG. 1 illustrates a front perspective view of a vehicle, such as an aircraft 10 (or aircraft assembly), according to an embodiment of the present disclosure. The aircraft 10 includes a propulsion system 12 that may include two turbofan engines 14, for example. Optionally, the propulsion system 12 may include more engines 14 than shown. The engines 14 are carried by wings 16 of the aircraft 10. In other embodiments, the engines 14 may be carried by a fuselage 18 and/or an empennage 20. The empennage 20 may also support horizontal stabilizers 22 and a vertical stabilizer 24.

The fuselage 18 of the aircraft 10 defines an interior cabin, which may include a cockpit, one or more work sections (for example, galleys, personnel carry-on baggage areas, and the like), one or more passenger sections (for example, first class, business class, and coach sections), and an aft section. Each of the sections may be separated by a cabin transition area, which may include one or more class divider assemblies. Overhead stowage bin assemblies may be positioned throughout the interior cabin.

Alternatively, instead of an aircraft, embodiments of the present disclosure may be used with various other vehicles, such as automobiles, buses, locomotives and train cars, seacraft, spacecraft, and the like.

Figure 2A:
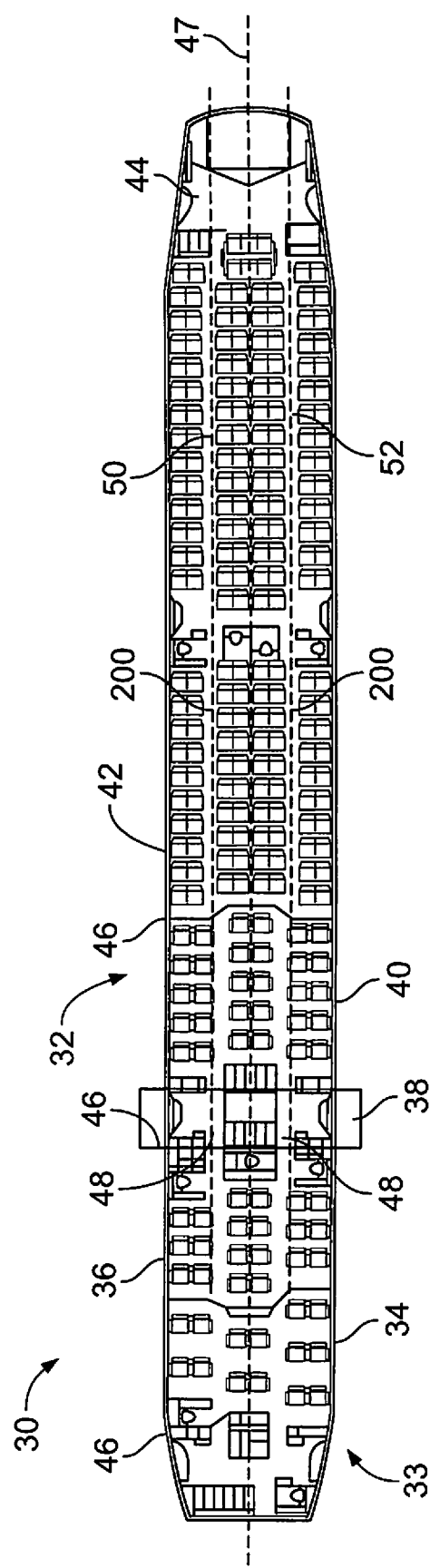
FIG. 2A illustrates a top plan view of an interior cabin of an aircraft, according to an embodiment of the present disclosure.

FIG. 2A illustrates a top plan view of an interior cabin 30 of an aircraft, according to an embodiment of the present disclosure. The interior cabin 30 may be within a fuselage 32 of the aircraft. For example, one or more fuselage wall members may define the interior cabin 30. The interior cabin 30 includes multiple sections, including a front section 33, a first class section 34, a business class section 36, a front galley station 38, an expanded economy or coach section 40, a standard economy or coach section 42, and an aft section 44, which may include multiple lavatories and galley stations. It is to be understood that the interior cabin 30 may include more or less sections than shown. For example, the interior cabin 30 may not include a first class section, and may include more or less galley stations than shown. Each of the sections may be separated by a cabin transition area 46, which may include class divider assemblies between aisles 48.

As shown in FIG. 2A, the interior cabin 30 includes two aisles 50 and 52 that lead to the aft section 44. Optionally, the interior cabin 30 may have less or more aisles than shown. For example, the interior cabin 30 may include a single aisle that extends through the center of the interior cabin 30 that leads to the aft section 44.

One or more electrical signal distribution systems 200 are secured to one or more structural components within the interior cabin 30. As shown, each electrical signal distribution system 200 may run parallel with a longitudinal axis 47 of the interior cabin 30. Optionally, the electrical signal distribution systems 200 may not be parallel to the longitudinal axis 47. For example, at least one electrical signal distribution system 200 may span across the interior cabin 30 such that it is perpendicular to the longitudinal axis 47. The interior cabin 30 may include more or less electrical distribution systems 200 than shown. For example, an electrical distribution system 200 may be positioned over each longitudinal section of seats onboard an aircraft.

The electrical signal distribution systems 200 may span from a fore or front section 33 to the aft section 44. The electrical signal distribution systems 200 may span an entire length of the interior cabin 30. Optionally, the electrical signal distribution systems 200 may span less than an entire length of the interior cabin 30.

The electrical signal distribution systems 200 may be secured to various structural components within the interior cabin 30. For example, the electrical signal distribution systems 200 may be securely mounted to strongbacks, PSU troughs, stowbins, passenger service unit (PSU) rails, floor member structure, ceiling structure, wall member structure, and/or the like. The electrical signal distribution systems 200 are configured to provide electrical signals, such as power signals and/or data signals, to various electrical devices within the interior cabin, as described below.

Figure 2B:
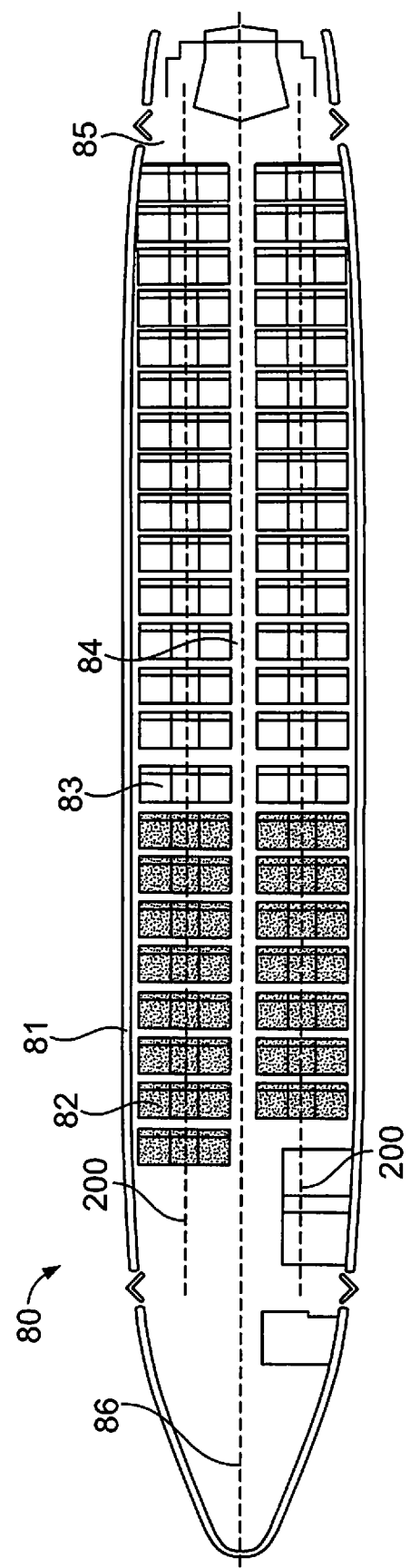
FIG. 2B illustrates a top plan view of an interior cabin of an aircraft, according to an embodiment of the present disclosure.

FIG. 2B illustrates a top plan view of an interior cabin 80 of an aircraft, according to an embodiment of the present disclosure. The interior cabin 80 may be within a fuselage 81 of the aircraft. For example, one or more fuselage wall members may define the interior cabin 80. The interior cabin 80 includes multiple sections, including a main cabin 82 having passenger seats 83, and an aft section 85 behind the main cabin 82. It is to be understood that the interior cabin 80 may include more or less sections than shown.

The interior cabin 80 may include a single aisle 84 that leads to the aft section 85. The single aisle 84 may extend through the center of the interior cabin 80 that leads to the aft section 85. For example, the single aisle 84 may be coaxially aligned with a central longitudinal plane 86 of the interior cabin 80. One or more electrical signal distribution systems 200 are secured to structural components within the interior cabin 80.

Figure 3:
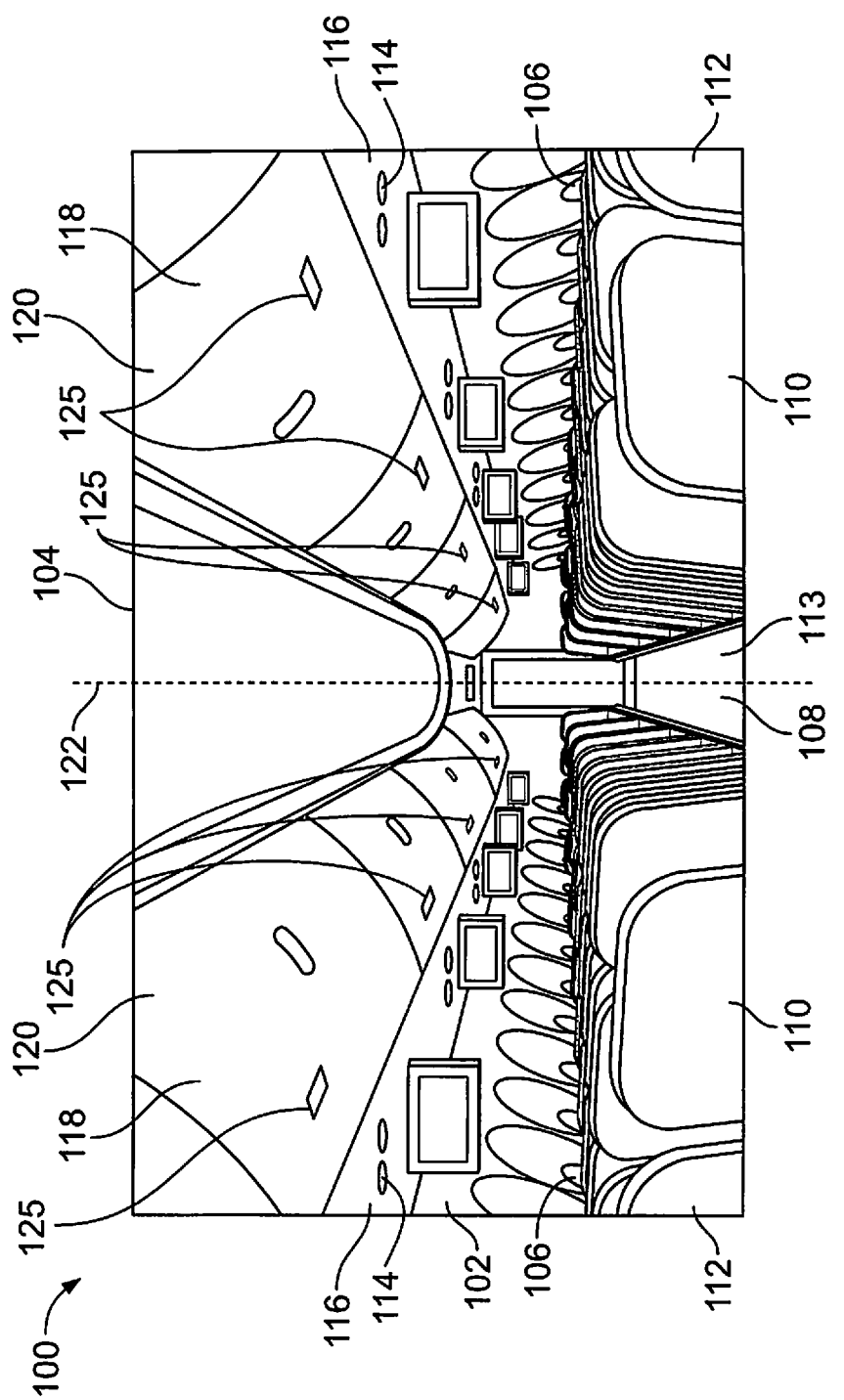
FIG. 3 illustrates an interior perspective view of an interior cabin of an aircraft, according to an embodiment of the present disclosure.

FIG. 3 illustrates an interior perspective view of an interior cabin 100 of an aircraft, according to an embodiment of the present disclosure. The interior cabin 100 includes outboard wall members 102 and a ceiling 104, which may include a plurality of ceiling panels. Windows 106 may be formed within the outboard wall members 102. A floor member 108 supports rows of seats 110. As shown in FIG. 3, a row 112 may include two seats 110 on either side of an aisle 113. However, the row 112 may include more or less seats 110 than shown. Additionally, the interior cabin 100 may include more aisles than shown.

Electrical devices such as PSUs 114 are secured between an outboard wall member 102 and the ceiling 104 on either side of the aisle 113. The PSUs 114 extend between a front end and rear end of the interior cabin 100. For example, a PSU 114 may be positioned over each seat 110 within a row 112. Each PSU 114 may include a housing 116 that generally contains passenger air outlets, reading lights, an oxygen supply system (such as an oxygen bag drop panel), an attendant call button, and other such controls over each seat 110 (or groups of seats) within a row 112.

Overhead stowage bin assemblies 118 are secured to the structure proximate to the ceiling 104 and/or the outboard wall member 102 above and inboard from the PSU 114 on either side of the aisle 113. The overhead stowage bin assemblies 118 are secured over the seats 110. The overhead stowage bin assemblies 118 extend between the front and rear end of the interior cabin 100. Each stowage bin assembly 118 may include a pivot bin or bucket 120 pivotally secured to a strongback (hidden from view in FIG. 3). The overhead stowage bin assemblies 118 may be positioned above and inboard from lower surfaces of the PSUs 114. The overhead stowage bin assemblies 118 are configured to be pivoted open in order to receive passenger carry-on baggage and personal items, for example.

As used herein, the term "outboard" means a position that is further away from a central longitudinal plane 122 of the interior cabin 100 as compared to another component. The term "inboard" means a position that is closer to the central longitudinal plane 122 of the interior cabin 100 as compared to another component. For example, a lower surface of a PSU 114 may be outboard in relation to a stowage bin assembly 118.

At least one electrical signal distribution system 200 (shown in FIGS. 2A and 2B, but hidden from view in FIG. 3) extends over a length of the interior cabin 100 and runs parallel with the longitudinal plane 122. For example, an electrical signal distribution system 200 may be mounted to strongbacks of the stowage bin assemblies 118. Optionally, the electrical signal distribution system 200 may be mounted to PSU rails that secure the PSUs 114 in position. As another example, the electrical signal distribution system 200 may be mounted to floor member or ceiling structure.

Electrical devices 125 may be mounted on the buckets 120 of the stowage bin assemblies 118. As shown, the electrical devices 125 may be secured to exterior surfaces of the buckets 120. Optionally, the electrical devices 125 may be secured to interior surfaces of the buckets 120. In at least one embodiment, the electrical devices 125 may be embedded within the buckets 120. The electrical device 125 may be one or more of an electric latch or lock, a speaker, a lighting assembly (such as one or more light emitting diodes), a monitor (such as a video screen and/or touchscreen), a fan, one or more sensors, and/or the like. Electrical devices may also be installed within a PSU trough, adjacent to reading light panels, for example.

Figure 4:
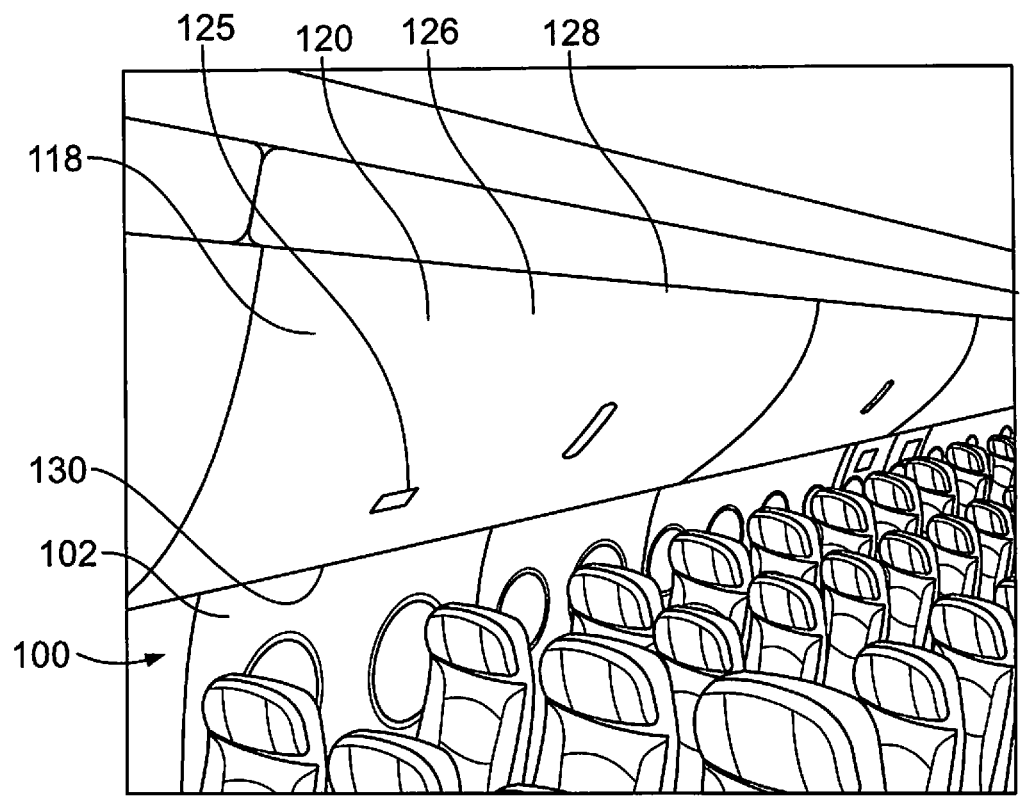
FIG. 4 illustrates a front perspective view of a stowage bin assembly in a closed position within an interior cabin, according to an embodiment of the present disclosure.

FIG. 4 illustrates a front perspective view of a stowage bin assembly 118 in a closed position within the interior cabin 100, according to an embodiment of the present disclosure. The stowage bin assembly 118 includes a bucket 120 having a front panel 126 connected to forward and aft end panels (hidden from view in FIG. 4). As shown, the front panel 126 may be an arcuate panel having a curved outer surface that curves downwardly toward the outboard wall member 102. As such, a top portion 128 of the front panel 126 is inboard in relation to a lower portion 130. The electrical device 125 may be secured to and/or embedded within the front panel 126.

Figure 5:
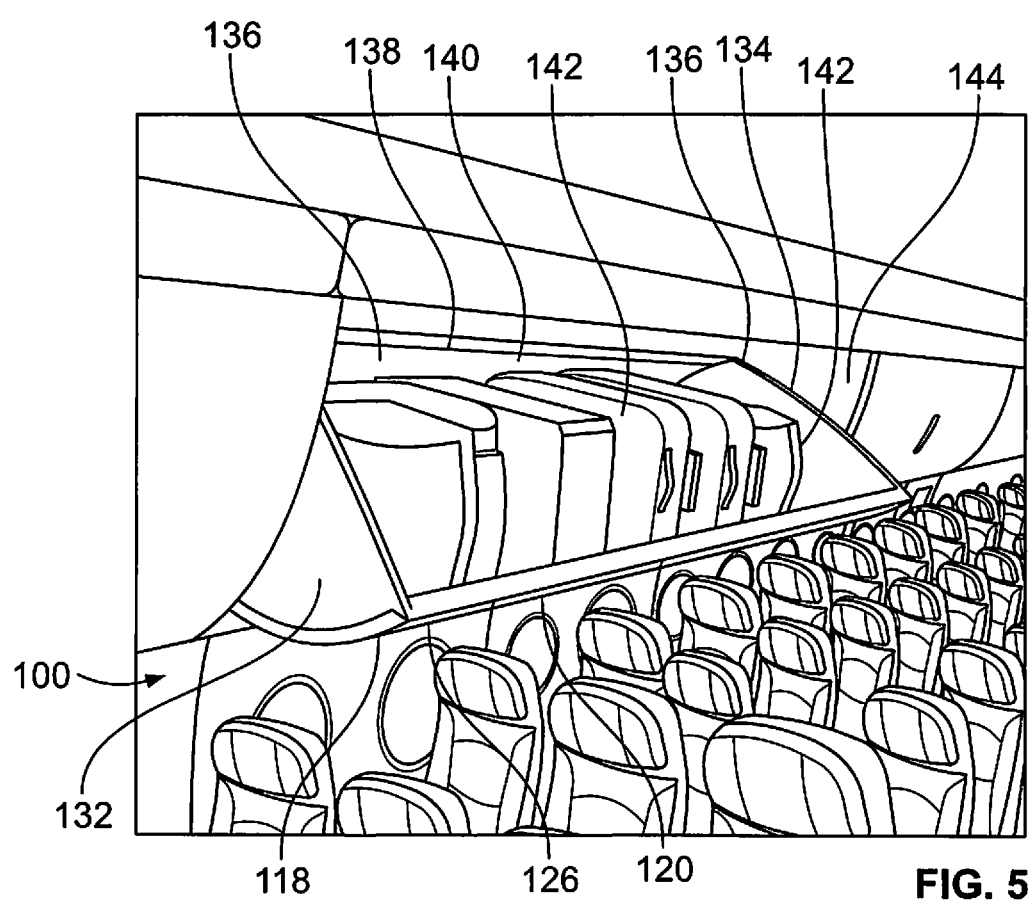
FIG. 5 illustrates a front perspective view of a stowage bin assembly in an open position within an interior cabin, according to an embodiment of the present disclosure.

FIG. 5 illustrates a front perspective view of the stowage bin assembly 118 in an open position within the interior cabin 100, according to an embodiment of the present disclosure. As shown, the front panel 126 is secured to a forward end panel 132 and an aft end panel 134, which may generally be opposed and parallel to one another. The front panel 126 and the end panels 132 and 134 may also connect to a bottom panel 136. The bottom panel 136 may be an inwardly curved portion of the front panel 126, for example. A closeout bracket 138 may span between the end panels 132 and 134 and provide a rigid bracing support therebetween. The front panel 126 may be thicker than the end panels 132 and 134, as the front panel 126 is configured to directly support a weight of overhead bags. As such, the front panel 126 may have increased thickness in order to provide additional support strength and rigidity.

A baggage retaining chamber 140 is defined between the front panel 126, the end panels 132 and 134, and the bottom panel 136. The baggage retaining chamber 140 is configured to receive baggage 142 when the stowage bin assembly 118 is in the open position.

The end panels 132 and 134 are each pivotally secured to fixed panels 144, such as fixed panels of a strongback. That is, the fixed panels 144 may be part of a strongback within the interior cabin 100.

Figure 6:
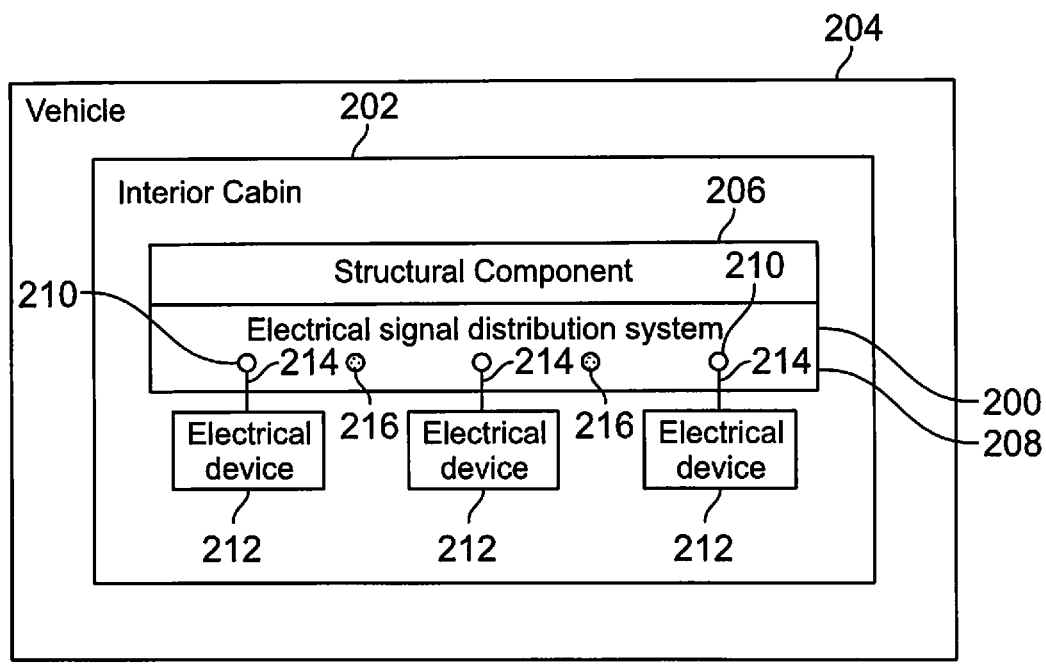
FIG. 6 illustrates a block diagram of an electrical signal distribution system within an interior cabin of a vehicle, according to an embodiment of the present disclosure.

FIG. 6 illustrates a block diagram of an electrical signal distribution system 200 within an interior cabin 202 of a vehicle 204, according to an embodiment of the present disclosure. The electrical signal distribution system 200 is securely mounted to a structural component 206 within the interior cabin 202. Alternatively, the electrical signal distribution system 200 may be integrally formed as part of the structural component 206 within the interior cabin 202. The structural component 206 may extend over a length of the interior cabin 202. In at least one embodiment, the structural component 206 is a strongback of a stowage bin assembly. In at least one embodiment, the structural component 206 is a PSU trough under the stowage bin assembly. In at least one embodiment, the structural component 206 is floor member structure within the interior cabin 202. For example, the structural component 206 may be a panel coupled to and/or between seat tracks of the floor member. In at least one embodiment, the structural component 206 is a longitudinal ceiling beam that extends over a length of the interior cabin 202. As another example, the structural component 206 may be an interior fuselage wall member.

The electrical signal distribution system 200 includes a printed circuit board (PCB) 208. In at least one embodiment, the PCB 208 is a multilayered PCB including one or more data layers, one or more power layers, and ground layers that surround the data layer(s). In at least one embodiment, the ground layers may surround both the power layer(s) and the data layer(s).

A plurality of outlets 210 are mounted to the PCB 208. For example, the plurality of outlets 210 may be formed in the PCB 208, and provide input ports. As another example, the plurality of outlets 210 may include electrical connectors mounted on the PCB 208. For example, the electrical connectors may be electrical plugs that are configured to removably couple to reciprocal receptacles, or vice versa.

The outlets 210 may be regularly spaced over a length of the PCB 208. For example, neighboring outlets 210 (that is, outlets 210 that are closest to one another) may be separated by a distance of 6 inches. Optionally, neighboring outlets 210 may be separated by a distance that is greater or less than 6 inches. The PCB 208 may include more or less outlets 210 than shown.

Electrical devices 212 within the interior cabin 202 electrically couple to the electrical signal distribution system 200 via the outlets 210. For example, each electrical device 212 may include an input 214 that electrically connects to a respective outlet 210. The input 214 may include a wire, cable, or the like that has a reciprocal connection member at a distal end. The reciprocal connection member (such as a plug or receptacle) removably couples to an outlet 210.

Unused outlets 210 may be capped with reciprocal connector termination caps 216. Optionally, the unused outlets 210 may not be capped.

The electrical devices 212 may be various devices onboard the vehicle 204. For example, the electrical devices 212 may be or include PSUs (or components thereof), lights, speakers, microphones, video monitors, charging devices (such as may be used to charge smart phones), and/or the like.

The outlets 210 may be electrical connectors having a receptacle that is configured to receive a reciprocal plug (or vice versa). When not in use, the termination caps 216 may be positioned over the receptacles. Connections 226 and 228 (shown in FIGS. 7 and 8) connect the receptacles to the layers of the PCB 208.

The electrical signal distribution system 200 may include more or less outlets 210 than shown. Further, the outlets 210 may include keyed interfaces, and/or coding to indicate the type of electrical device that is to be mated thereto, as described above.

Figure 7:
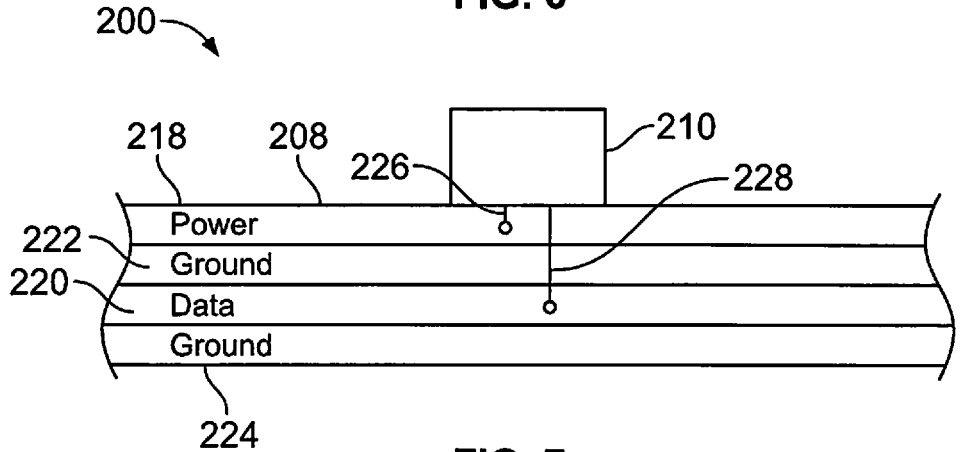
FIG. 7 illustrates a simplified transverse cross-sectional view of a portion of an electrical signal distribution system, according to an embodiment of the present disclosure.

FIG. 7 illustrates a simplified transverse cross-sectional view of a portion of an electrical signal distribution system 200, according to an embodiment of the present disclosure. The electrical signal distribution system 200 includes the PCB 208, which may be a multi-layered PCB. The PCB 208 may include a power layer 218 overlaying a data layer 220. Optionally, the data layer 220 may overlay the power layer 218. A ground layer 222 is secured over the power layer 218, while another ground layer 224 is secured beneath the data layer 220.

The power layer 218 and the data layer 220 each include a substrate (such as formed of PCB material) that supports signal traces (such as copper traces), vias, through-holes, and/or the like that allow electrical signals to be transmitted therethrough and to an outlet 210. The outlet 210 may include a power connection (such as a pin, contact tail, lead, or the like) 226 that electrically connects to the power layer 218, and a data connection 228 that connects to the data layer 220. As such, power signals may be transferred from the power layer 218 to the outlet 210 (and ultimately to an attached electrical device 212, shown in FIG. 6), and data signals may be transferred from the data layer 220 to the outlet 218 (and ultimately to the attached electrical device 212).

As shown, the data layer 220 is sandwiched between the opposing ground layers 222 and 224. The ground layers 222 and 224 provide shields that prevent or otherwise reduce signal noise, interference, and the like from propagating out of the PCB 208. The distances between the ground layers 222 and 224 and the data layer 220 may be spaced to optimize impedance matching of data transmission lines of the data layer 220. In at least one embodiment, the ground layers 222 and 224 are part of a single ground structure that encapsulates the data layer 220 therein. The power layer 218 may be positioned over the ground layer 222, or under the ground layer 224.

Alternatively, the power layer 218 and the data layer 220 may be sandwiched between the opposing ground layers 222 and 224. In at least one embodiment, the ground layers 222 and 224 may be part of a single ground structure that encapsulates the power layer 218 and the data layer 220 therein The power layer 218 is configured to provide power signals to the electrical devices 212 (shown in FIG. 6) that are coupled to the outlets 210. The data layer 220 is configured to provide data signals to the electrical devices 212 that are coupled to the outlets 210. The electrical devices 212 may all be of the same type. In at least one other embodiment, at least some of the electrical devices 212 may differ from one another.

Figure 8:
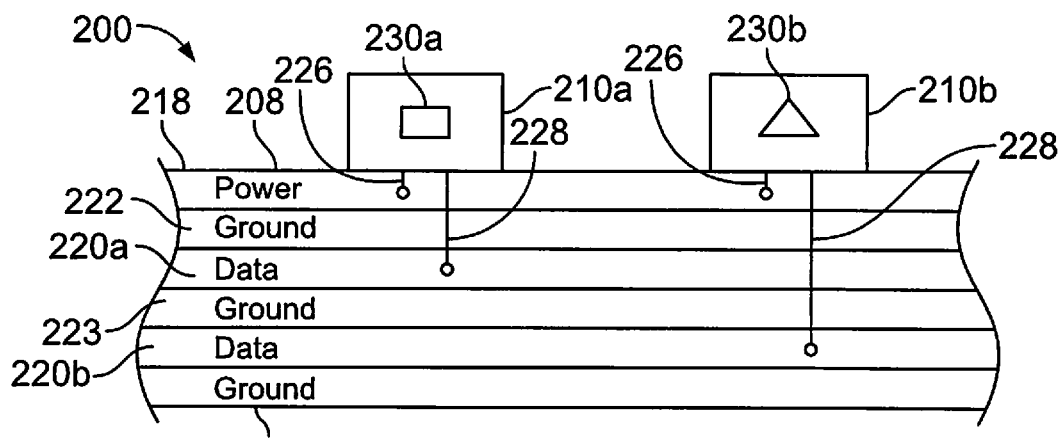
FIG. 8 illustrates a simplified transverse cross-sectional view of a portion of an electrical signal distribution system, according to an embodiment of the present disclosure.

FIG. 8 illustrates a simplified transverse cross-sectional view of a portion of an electrical signal distribution system 200, according to an embodiment of the present disclosure. The electrical signal distribution system 200 is similar to that shown and described with respect to FIG. 7, except that the electrical signal distribution system 200 shown in FIG. 8 includes multiple data layers 220a and 220b separated from one another by an internal ground layer 223. Optionally, the data layers 220a and 220b may not be separated by the internal ground layer 223.

The outlets 210a and 210b are electrically connected to the power layer 218. The outlet 210a is electrically connected to the data layer 220a, while the outlet 210b is electrically connected to the data layer 220b. The outlets 210a and 210b may include keys 230a and 230b that are each configured to mate with specific types of electrical devices. For example, the key 230a may be a specific structural interface that is configured to mate with a specific type of electrical device, while the key 230b may be a different specific structural interface that is configured to mate with a different specific type of electrical device. The data layers 220a and 220b may each be specifically configured for data transmission with separate and distinct types of electrical devices. The keys 230a and 230b allow an individual to distinguish the particular type of electrical device to be mated with the particular outlet 210a and 210b. Moreover, the outlets 210a and 210b may include distinguishing codes, such as numeric and/or alphabetic codes, phrases, words, colors, and/or the like that allow an individual to distinguish which type of electrical device is to be mated thereto.

The electrical signal distribution system 200 may include more or less outlets having more or less keys than shown. Further, the electrical signal distribution system 200 may include more data layers and/or ground layers than shown.

Figure 9:
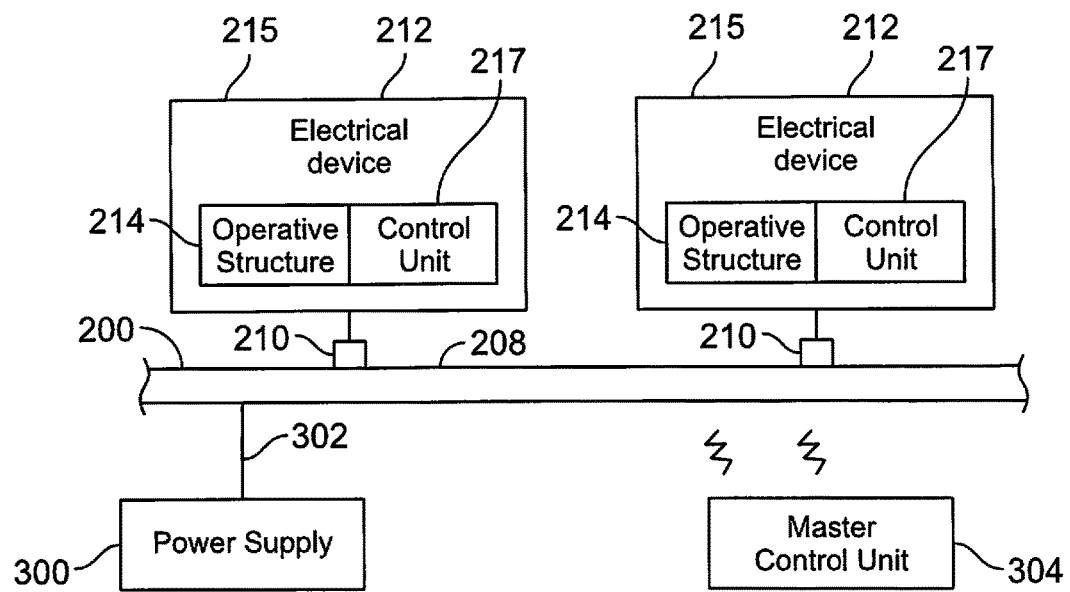
FIG. 9 illustrates a simplified schematic diagram of electrical devices coupled to an electrical signal distribution system, according to an embodiment of the present disclosure.

FIG. 9 illustrates a simplified schematic diagram of electrical devices 212 coupled to the electrical signal distribution system 200 (such as any of those described above), according to an embodiment of the present disclosure. Each electrical device 212 may include a housing 215 that contains or otherwise supports an operative structure 214 in communication with a control unit 217, such as through one or more wired or wireless connections. For example, at least one of the electrical devices 212 may be a PSUs and the operative structure 214 may be an overhead light. As another example, at least one of the electrical devices 212 may be a lighting assembly in which the operative structure 214 is a light secured to a ceiling, wall member, or floor member. In at least one other embodiment, an operative structure 214 of at least one of the electrical devices 212 may be a microphone, a speaker, a video display, one or more sensors, or the like, that is mounted to a wall member, seat, ceiling, or the like. Alternatively, the electrical devices 214 may not include their own control units 216 within the housings 215.

A power supply 300 is coupled to the electrical signal distribution system 200. For example, the power supply 300 may be a direct current (DC) or alternating current (AC) power supply within an aircraft. The power supply 300 couples to the power layer 218 (shown in FIGS. 7 and 8) of the PCB 208 of the electrical signal distribution system 200, such as through a wired connection 302. In at least one embodiment, the wired connection 302 includes a distal plug or receptacle that couples to an outlet of the PCB 208.

The control units 216 are configured to control operation of the electrical devices 212. Prior known PSUs did not include separate and distinct control units. Instead, separate and distinct controllers were connected to the PSUs through wired bundles, which add weight and complexity during a manufacturing process. In contrast, PSUs according to an embodiment of the present disclosure, may include their own control units 216, which eliminates the need for separate and distinct controllers and wire bundles. While the control units 216 may add weight to the PSUs themselves, the overall weight of a vehicle is decreased, because there is no need to connect separate and distinct controllers within a PSU trough to the PSUs through wire bundles.

Moreover, each control unit 217 provides an address that identifies the specific electrical device 212. As such, the electrical devices 212 may be removed from one position and located at another position. A master control unit 304 (such as part of a main computer onboard a vehicle) may be in communication with each control unit 217 of the electrical devices 212 through one or more wired or wireless connections, and/or through the electrical signal distribution system 200. In at least one embodiment, the master control unit 304 may connect to the electrical signal distribution system 200 through a wired connection, and be able to communicate with the control units 216 through the electrical signal distribution system 200. In at least one other embodiment, the master control unit 304 wirelessly connects to the control units 216, such as through IEEE 802.15.4 or IEEE 802.11 (WiFi).

Logical-to-physical mapping is a process of establishing relative positions of each electrical device 212 within a location, such as an interior cabin of an aircraft. Both wired and wireless architectures may use data traces for logical-to-physical mapping. Each time an electrical device 212 is connected to the electrical signal distribution system 200, the master control unit 304 detects a configuration mismatch and initiates logical-to-physical mapping. By way of a physical connection to the master control unit 304, an asserted input, programming, part selection, and/or the like, the first device in a contiguous array of devices is identified as the first unit to derive its relative position during logical-to-physical mapping. For wired systems, the contiguous electrical devices increment a numerical seed originating from the master control unit 304 as they cascade a token number down a column of devices. For wireless systems, the electrical devices have input/output pairs between contiguous devices using at least one of the data layers as a communication enabling line to sequentially allow each electrical device to register its relative position with the master control unit when an adjacent device asserts the input pin, having completed its own registration. In this manner, the master control unit 304 is able to identify the exact location of the electrical device 212, for either wired or wireless devices, onboard a vehicle, even if the electrical device 212 has been moved to a different location.

As used herein, the term "control unit," "central processing unit," "CPU," "computer," or the like may include any processor-based or microprocessor-based system including systems using microcontrollers, reduced instruction set computers (RISC), application specific integrated circuits (ASICs), logic circuits, and any other circuit or processor including hardware, software, or a combination thereof capable of executing the functions described herein. Such are exemplary only, and are thus not intended to limit in any way the definition and/or meaning of such terms. For example, the control units 216 and the master control unit 304 may be or include one or more processors that are configured to control operations, as described above.

Each of the control units 216 and the master control unit 304 is configured to execute a set of instructions that are stored in one or more data storage units or elements (such as one or more memories), in order to process data. For example, each of the control units 216 and the master control unit 304 may include or be coupled to one or more memories. The data storage units may also store data or other information as desired or needed. The data storage units may be in the form of an information source or a physical memory element within a processing machine.

The set of instructions may include various commands that instruct each of the control units 216 and the master control unit 304 as a processing machine to perform specific operations such as the methods and processes of the various examples of the subject matter described herein. The set of instructions may be in the form of a software program. The software may be in various forms such as system software or application software. Further, the software may be in the form of a collection of separate programs, a program subset within a larger program, or a portion of a program. The software may also include modular programming in the form of object-oriented programming. The processing of input data by the processing machine may be in response to user commands, or in response to results of previous processing, or in response to a request made by another processing machine.

The diagrams of examples herein may illustrate one or more control or processing units, such as the control units 216 and the master control unit 304. It is to be understood that the processing or control units may represent circuits, circuitry, or portions thereof that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. Optionally, each of the control units 216 and the master control unit 304 may represent processing circuitry such as one or more of a field programmable gate array (FPGA), application specific integrated circuit (ASIC), microprocessor(s), and/or the like. The circuits in various examples may be configured to execute one or more algorithms to perform functions described herein. The one or more algorithms may include aspects of examples disclosed herein, whether or not expressly identified in a flowchart or a method.

As used herein, the terms "software" and "firmware" are interchangeable, and include any computer program stored in a data storage unit (for example, one or more memories) for execution by a computer, including RAM memory, ROM memory, EPROM memory, EEPROM memory, and non-volatile RAM (NVRAM) memory. The above data storage unit types are exemplary only, and are thus not limiting as to the types of memory usable for storage of a computer program.

Figure 10:
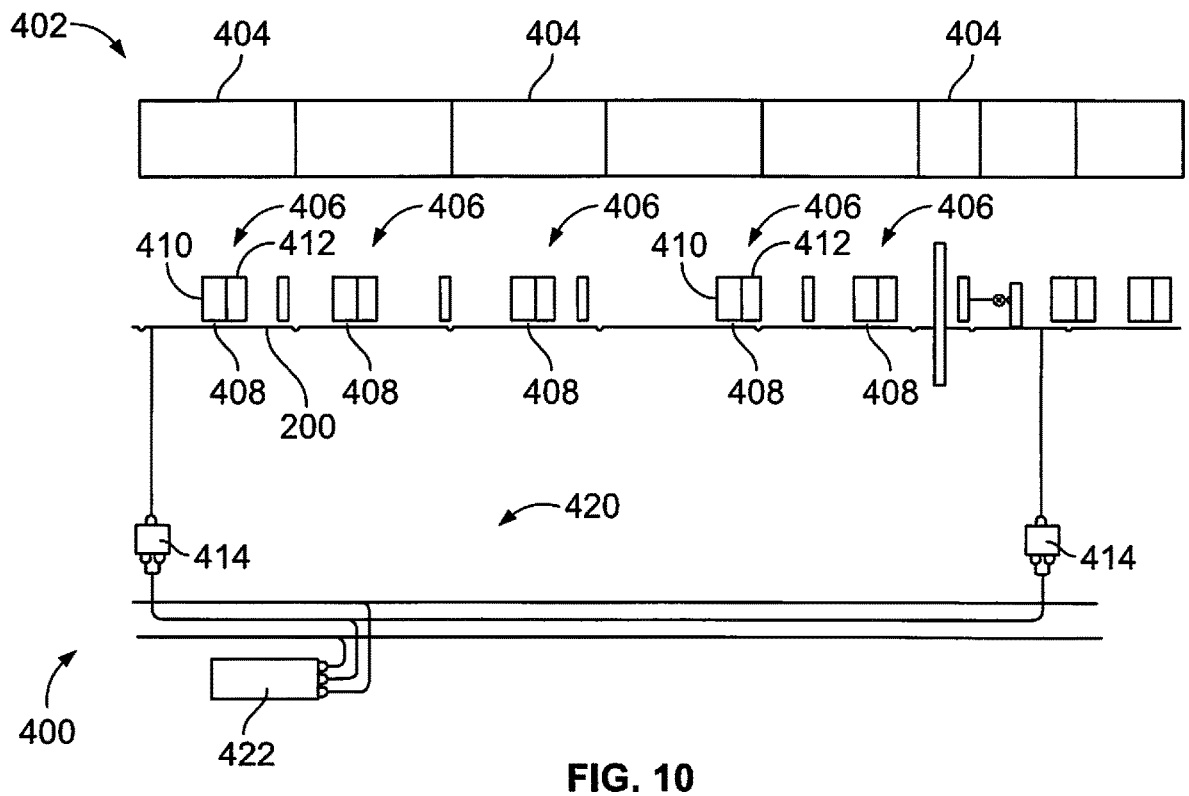
FIG. 10 illustrates a schematic diagram of a portion of an interior cabin of a vehicle, according to an embodiment of the present disclosure.

FIG. 10 illustrates a schematic diagram of a portion of an interior cabin 400 of a vehicle 402, according to an embodiment of the present disclosure. The interior cabin 400 includes a plurality of overhead stowage bin assemblies 404 for a plurality of rows 406. A PSU 408 is secured underneath the stowage bin assemblies 404 above each row 406. Each PSU 408 includes an overhead light 410 and an oxygen supply system 412.

An electrical signal distribution system 200 may be secured below or otherwise in close proximity to the PSUs 406. For example, the electrical signal distribution system 200 may be securely mounted to a PSU rail or trough that secures the PSU 406 in position within the interior cabin 400.

A power supply 414 provides power to the electrical signal distribution system 200. In at least one embodiment, the power supply 414 is secured in a crown of the interior cabin 400 above ceiling panels. Each PSU 408 is coupled to the electrical signal distribution system 200 through outlets 210 (shown in FIGS. 6-9), as described above.

As shown, a PSU trough 420 may include the power supply 414 that couples to the electrical signal distribution system 200 and a distribution panel 422. However, the PSU trough 420 is devoid of bulky wire bundles that would otherwise separately connect the PSUs 408 to power supplies and separate and distinct controllers. As explained above with respect to FIG. 9, each PSU 408 may include a control unit 217 that is configured to control operation of the PSU 408, thereby eliminating the need to connect the PSUs 408 to separate and distinct controllers through wire bundles.

The electrical signal distribution system 200 may be configured to be secured underneath each stowage bin assembly 406. Adjacent electrical distribution systems 200 may modularly connect together at ends, thereby allowing an electrical signal distribution system 200 of a desired length to be formed.

Figure 11:
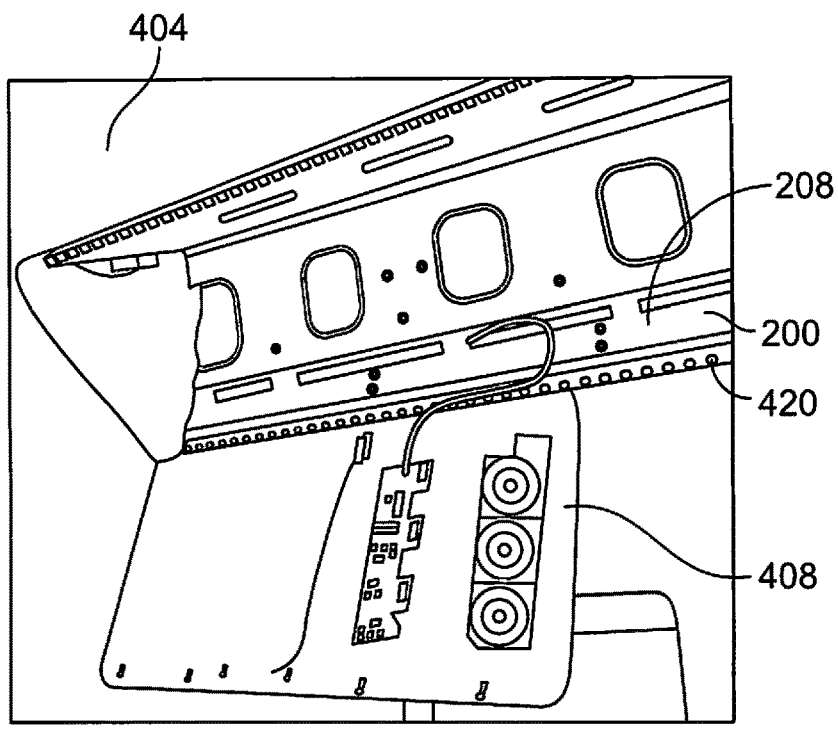
FIG. 11 illustrates a front perspective view of an electrical signal distribution system mounted on a passenger service unit trough, according to an embodiment of the present disclosure.

FIG. 11 illustrates a front perspective view of an electrical signal distribution system 200 mounted on a PSU trough 420, according to an embodiment of the present disclosure. The PSUs 408 are secured to parallel longitudinal rails 500 positioned below stowage bin assemblies 404. The rails 500 are parallel with a longitudinal axis of an interior cabin.

The PCB 208 of the electrical distribution system 200 may securely mount to the PSU trough 420, such as within a channel therein, through fasteners, adhesives, and/or the like. In at least one other embodiment, the PCB 208 may secure to a side of the PSU trough 420. In at least one other embodiment, the PCB 208 may secure underneath to the PSU trough 420.

Figure 12:
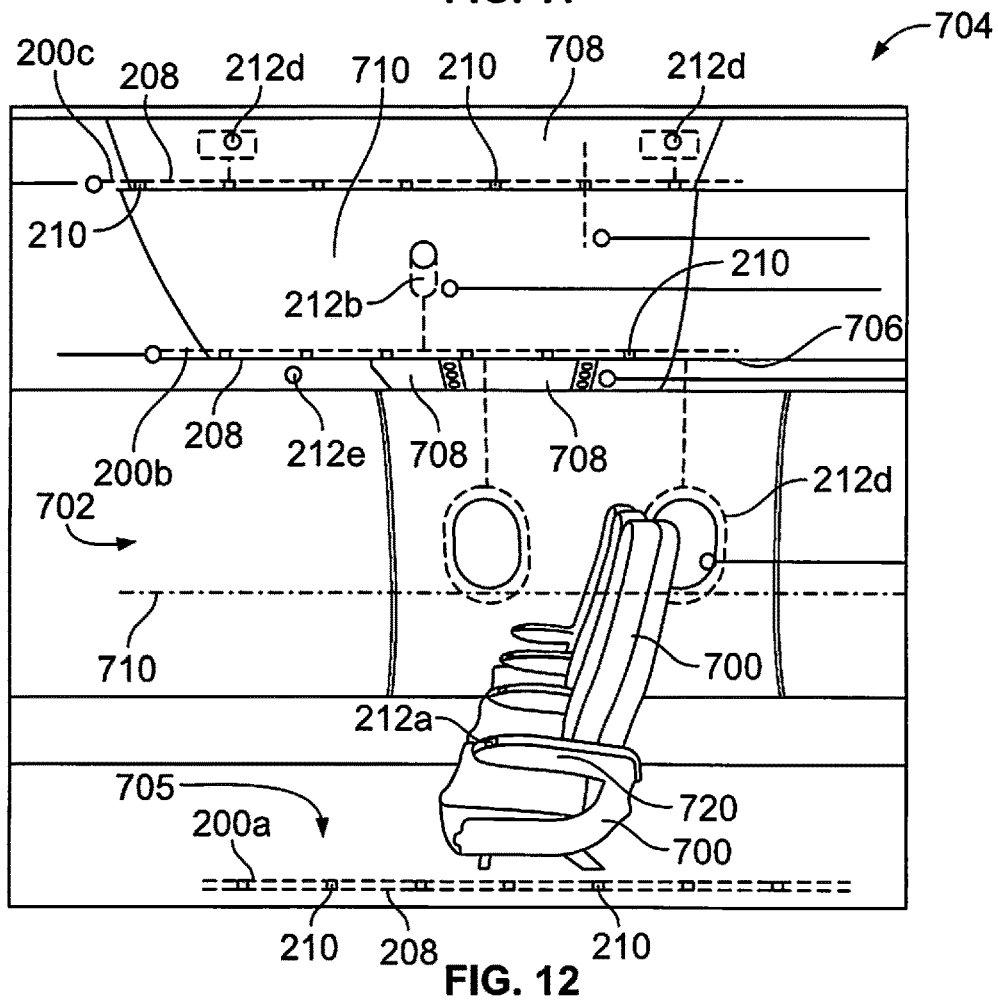
FIG. 12 illustrates a lateral perspective view of a row of seats within an interior cabin of a vehicle, according to an embodiment of the present disclosure.

FIG. 12 illustrates a lateral perspective view of a row of seats 700 within an interior cabin 702 of a vehicle 704, according to an embodiment of the present disclosure. The interior cabin 702 may include a first electrical signal distribution system 200a mounted to a floor member 705 of the interior cabin, a second electrical signal distribution system 200b mounted to a PSU rail 706 that supports PSUs 708 below stowage bin assemblies 710, and a third electrical signal distribution system 200c mounted to a ceiling 708 of the interior cabin 702. Optionally, the interior cabin 702 may include less than all of the electrical signal distribution systems 200a, 200b, and 200c.

As shown, the electrical signal distribution systems 200a, 200b, and 200c extend along a length of the interior cabin 702. The electrical signal distribution systems 200a, 200b, and 200c are parallel with a central longitudinal axis 710 of the interior cabin 702, or at least a portion thereof. Optionally one or more electrical signal distribution systems may be laterally oriented with respect to the interior cabin 702, such that they are perpendicular to the central longitudinal axis 710.

Various electrical devices may be coupled to the outlets 210 of the electrical signal distribution systems 200a, 200b, 200c. For example, consoles 212a on armrests 720 of the seats 700 may be electrically coupled to the electrical signal distribution system 200a. The consoles 212a may be or include a display, such as a monitor, touchscreen, and/or the like. Optionally, the consoles 212a may be mounted to rear surfaces of seats. The PSUs 708 and stowbin latches 212b may be electrically coupled to the electrical signal distribution system 200b. Accent lighting assemblies 212 and speakers 214 may be electrically coupled to the electrical signal distribution system 200c. Further, lighting assemblies 212d may be electrically coupled to the electrical distribution system 200b.

Also, microphones 212e may be electrically coupled to the electrical distribution system 200b. The microphones 212e may be located throughout the interior cabin 702, and allow a flight attendant to broadcast messages during a flight.

The electrical signal distributions systems 200a-c replace wiring and bundles traditionally used to connect electrical devices to power and data sources. Regularly-spaced outlets 210 on the PCBs 208 allow for quick and easy connection to various electrical devices throughout the interior cabin 702.

Figure 13:
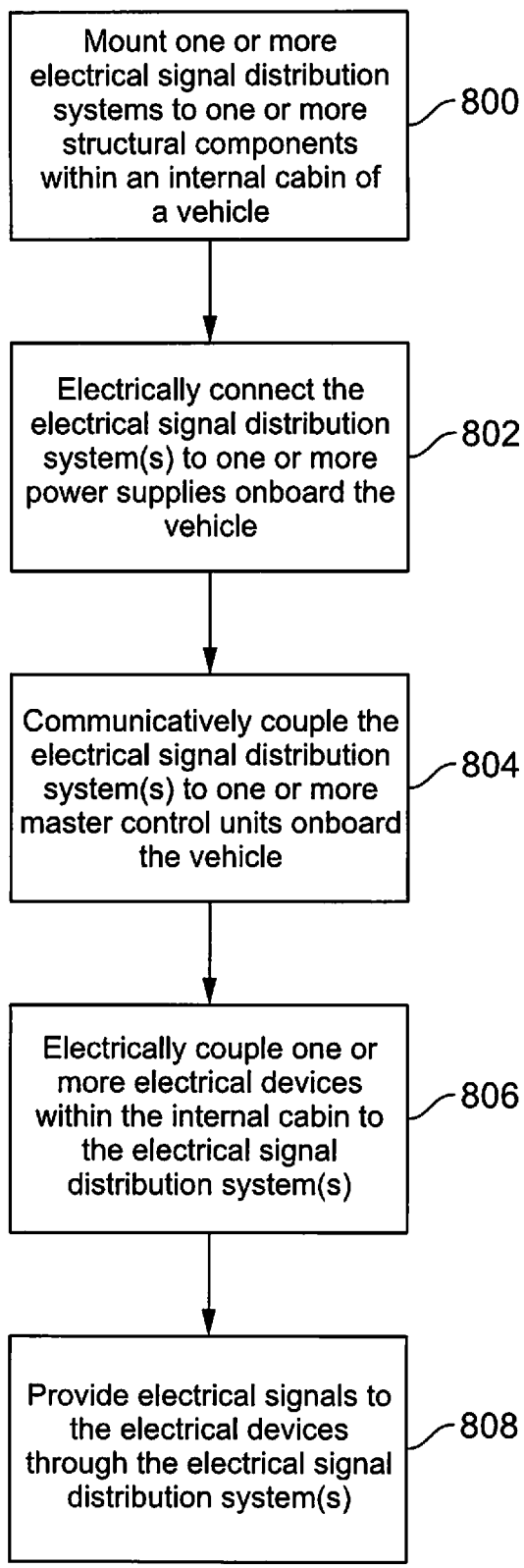
FIG. 13 illustrates a flow chart of a method of electrically coupling electrical devices to an electrical signal distribution system within an interior cabin of a vehicle, according to an embodiment of the present disclosure.

FIG. 13 illustrates a flow chart of a method of electrically coupling electrical devices to an electrical signal distribution system within an interior cabin of a vehicle, according to an embodiment of the present disclosure. The method begins at 800, in which one or more electrical signal distributions are mounted to one or more structural components within the interior cabin of the vehicle.

At 802, the electrical signal distribution system(s) is electrically connected to one or more power supplies onboard the vehicle. At 804, the electrical signal distribution system is communicatively coupled to one or more master control units onboard the vehicle. Optionally, the method may not include 804.

At 806, one or more electrical devices within the interior cabin are electrically coupled to the electrical signal distribution system. Then, at 808, electrical signals may be provided to the electrical devices through the electrical signal distribution system(s).

As described above, embodiments of the present disclosure provide electrical signal distribution systems that reduce the need for bulky wire bundles within an interior cabin of a vehicle. The electrical signal distribution systems provide a plurality of outlets that are configured to electrically connect to electrical devices within the interior cabin. The outlets may be regularly spaced on a PCB. An installer is able to readily determine the location of the outlets and couple electrical devices thereto. Embodiments of the present disclosure greatly reduce the time, labor, and effort of electrically connecting electrical devices to data and/or power sources onboard a vehicle. The electrical signal distribution systems may be pre-attached to structural components within an interior cabin, in contrast to prior systems, in which particular controllers and power sources needed to be located and coupled to electrical devices.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A vehicle comprising:
an interior cabin including a floor member that supports seats;
a plurality of electrical devices within the interior cabin;
a power supply; and
an electrical signal distribution system coupled to the floor member and electrically coupled to the power supply and the plurality of electrical devices, wherein the electrical signal distribution system comprises:
a printed circuit board (PCB), wherein the PCB is a multi-layer PCB comprising a power layer having a first substrate coupled to at least one data layer having a second substrate that differs from the first substrate; and
a plurality of outlets coupled to the PCB, wherein the plurality of outlets are configured to electrically couple to the plurality of electrical devices, wherein the electrical signal distribution system provides electrical signals to the plurality of electrical devices, wherein at least one of the plurality of outlets comprises an electrical connector mounted on the PCB, the electrical connector comprising a power connection to the power layer and a data connection to the at least one data layer.

2. The vehicle of claim 1, wherein the PCB further comprises first and second ground layers, wherein the at least one data layer is sandwiched between the first and second ground layers.

3. The vehicle of claim 1, wherein the electrical signal distribution system extends linearly along at least a portion of a length of the interior cabin, and wherein the PCB is parallel with a central longitudinal axis of the interior cabin.

4. The vehicle of claim 1, wherein the outlets are spaced over a length of the PCB.

5. The vehicle of claim 1, wherein the electrical signals comprise power signals and data signals.

6. The vehicle of claim 1, further comprising a master control unit in communication with the plurality of electrical devices.

7. The vehicle of claim 6, wherein each of the plurality of electrical devices comprises a control unit, wherein the master control unit is in communication with the control unit of each of the plurality of electrical devices, and wherein the master control unit automatically determines a location of the each of the plurality of electrical devices in response to each of the plurality of electrical devices electrically coupling to the electrical signal distribution system.

8. The vehicle of claim 6, wherein, in response to one of the plurality of electrical devices being connected to the electrical signal distribution system, the master control unit is configured to detect a configuration mismatch and initiate logical-to-physical mapping such that the master control unit communicates with and identifies a relative position of the one of the plurality of electrical devices being connected.

9. The vehicle of claim 1, wherein at least two of the plurality of outlets include different keys or coding that are associated with different types of electrical devices.

10. The vehicle of claim 1, wherein at least one of the plurality of electrical devices comprises a lighting assembly.

11. The vehicle of claim 1, wherein at least one of the plurality of electrical devices comprises a speaker.

12. The vehicle of claim 1, wherein at least one of the plurality of electrical devices comprises a microphone.

13. The vehicle of claim 1, wherein at least one of the plurality of electrical devices comprises a display.

14. The vehicle of claim 1, wherein the electrical signal distribution system is directly mounted to the floor member.

15. The vehicle of claim 1, wherein the first electrical signal distribution system is configured to modularly connect to one or more additional electrical signal distribution systems.

16. The vehicle of claim 1, wherein the electrical signal distribution system is directly mounted to a panel of the floor member, wherein the panel is between seat tracks.

17. A method of providing electrical signals to a plurality of electrical devices within an interior cabin of a vehicle, the method comprising:

providing a printed circuit board (PCB) of an electrical signal distribution system;

coupling a plurality of outlets to the PCB, wherein the PCB is a multi-layer PCB comprising a power layer having a first substrate coupled to at least one data layer having a second substrate that differs from the first substrate, wherein at least one of the plurality of outlets comprises an electrical connector mounted on the PCB, the electrical connector comprising a power connection to the power layer and a data connection to the at least one data layer;

mounting the electrical signal distribution system to a floor member that supports seats within the interior cabin of the vehicle;

electrically coupling the electrical signal distribution system to a power supply within the interior cabin of the vehicle;

electrically coupling at least one of the plurality of outlets to at least one of the plurality of electrical devices; and providing the electrical signals to the at least one of the plurality of electrical devices through the electrical signal distribution system.

18. The method of claim 17, further comprising modularly connecting the electrical signal distribution system to one or more additional electrical distribution systems.

19. The method of claim 17, further comprising detecting, by at least one control unit, a configuration mismatch and initiating, by the at least one control unit, logical-to-physical mapping in response to one of the plurality of electrical devices being connected to the electrical signal distribution system such that the at least one control unit communicates with and identifies a relative position of the one of the plurality of electrical devices being connected.

* * * * *